United States Patent
Coutellier et al.

(10) Patent No.: US 10,914,806 B2
(45) Date of Patent: Feb. 9, 2021

(54) METHOD FOR DYNAMIC COMPENSATION FOR THE OFFSET ERROR OF AN ACQUISITION SYSTEM COMPRISING A CURRENT SENSOR

(71) Applicant: SEB S.A., Ecully (FR)

(72) Inventors: Damien Coutellier, Pierre Benite (FR); Louis Schmerber, Roussillon (FR)

(73) Assignee: SEB S.A.

( * ) Notice: Subject to any disclaimer, the term of this patent is extended or adjusted under 35 U.S.C. 154(b) by 0 days.

(21) Appl. No.: 16/469,011

(22) PCT Filed: Dec. 11, 2017

(86) PCT No.: PCT/FR2017/053504
§ 371 (c)(1),
(2) Date: Jun. 12, 2019

(87) PCT Pub. No.: WO2018/109351
PCT Pub. Date: Jun. 21, 2018

(65) Prior Publication Data
US 2019/0317176 A1 Oct. 17, 2019

(30) Foreign Application Priority Data
Dec. 13, 2016 (FR) ..................... 16 62391

(51) Int. Cl.
*H02P 23/14* (2006.01)
*G01R 35/00* (2006.01)
*G01R 31/34* (2020.01)

(52) U.S. Cl.
CPC .......... *G01R 35/005* (2013.01); *G01R 31/34* (2013.01); *H02P 23/14* (2013.01)

(58) Field of Classification Search
CPC ...... H02P 6/10; H02P 6/14; H02P 6/28; H02P 27/06; H02P 21/22; H02P 2205/01
See application file for complete search history.

(56) References Cited

U.S. PATENT DOCUMENTS

| 5,945,853 A | 8/1999 | Sano |
| 6,674,322 B2 | 1/2004 | Motz |

(Continued)

OTHER PUBLICATIONS

International Search Report as issued in International Patent Application No. PCT/FR2017/053504, dated Feb. 6, 2018.

*Primary Examiner* — Rina I Duda
(74) *Attorney, Agent, or Firm* — Lerner, David, Littenberg, Krumholz & Mentlik, LLP (57) ABSTRACT

A method for dynamically compensating for the offset error of an acquisition system includes a current sensor to measure or estimate the current passing through an actuator of a electrical apparatus that is electrically supplied by an AC voltage, the acquisition system having a predetermined offset value, the method includes determining a plurality of periodic temporal operating ranges of the actuator in order to dynamically apply a compensation sequence for the offset error of the acquisition system, executing the compensation sequence during any one among the plurality of determined temporal operating ranges, the synchronization between the any one of the determined temporal operating ranges of the actuator and the execution of the compensation sequence being performed using a synchronization system including a synchronization module designed to identify reference times from the AC supply voltage of the sector.

6 Claims, 5 Drawing Sheets

(56) References Cited

U.S. PATENT DOCUMENTS

| | | | |
|---|---|---|---|
| 8,618,789 B2 | 12/2013 | Finke et al. | |
| 8,981,701 B2 | 3/2015 | Choi | |
| 2013/0154526 A1* | 6/2013 | Choi | G01R 35/005 318/400.04 |
| 2014/0239861 A1 | 8/2014 | Ajima et al. | |
| 2014/0253004 A1 | 9/2014 | Gebregergis et al. | |
| 2015/0115832 A1* | 4/2015 | Conroy | H03M 1/70 315/294 |
| 2015/0214881 A1* | 7/2015 | Choi | H02P 6/10 318/400.26 |
| 2016/0276969 A1 | 9/2016 | Krefta | |

* cited by examiner

METHOD FOR DYNAMIC COMPENSATION FOR THE OFFSET ERROR OF AN ACQUISITION SYSTEM COMPRISING A CURRENT SENSOR

CROSS REFERENCE TO RELATED APPLICATIONS

This application is the U.S. National Stage of PCT/FR2017/053504, filed Dec. 11, 2017, which in turn claims priority to French Patent Application No. 1662391 filed Dec. 13, 2016, the entire contents of all applications are incorporated herein by reference in their entireties.

FIELD OF INVENTION

This invention relates to the general technical field of industrial metrology in electronics.

More specifically, this invention relates to a method for dynamic compensation for the offset error of an acquisition system comprising a current sensor designed to measure or estimate the current passing through an actuator of an electrical apparatus that is electrically powered by an AC voltage, said acquisition system having a predetermined offset value.

BACKGROUND OF THE INVENTION

Such an electrical apparatus may belong to the family of electrical household appliances, for example.

In electrical household appliances it is necessary to measure the current passing through various electrical or electromechanical actuators in order to deduce from this the value of a characteristic variable necessary for the operation of the appliance.

In this way, on certain appliances, the measurement of current is performed by a dedicated acquisition system which, in combination with a processing means, makes it possible, for example, to determine an engine torque, an instantaneous power, a power consumed, to detect a threshold crossing or to perform a current regulation.

The precision of these determinations depends directly on the precision of the current measurement.

However, this precision also depends directly on the cost of the acquisition system and thus of the apparatus. An extremely precise acquisition system will be much more expensive than a less precise solution.

There are several types of errors on a measurement acquisition system leading to imprecise measurements, the main types being offset error, gain error and/or noise-induced error.

This invention concerns in particular a method for compensating for the offset error on a measurement acquisition system comprising a current sensor.

Each acquisition system has a theoretical offset, more generally called the acquisition system offset.

This acquisition system offset is intrinsically related to the various components used in the acquisition system and can be calculated based on the theoretical characteristics of these components.

The presence of an offset error leads to a drift over time in the current measurement by the sensor.

This measurement drift over time of an acquisition system is primarily related to a change in the ambient temperature in which the acquisition system is integrated within the apparatus.

In addition, a change in the measurement drift of an acquisition system is particularly significant on relatively long acquisition times, ranging from one second to about ten seconds.

It is known to implement several methods for compensating for an offset error in an acquisition system comprising a current sensor.

The documents U.S. Pat. Nos. 5,945,853A and 6,674,322B2 describe a method using active compensation and necessitating a dedicated circuit.

However, this method is costly and burdensome, since it necessitates adding an auxiliary circuit to the existing acquisition system.

The document U.S. Pat. No. 8,618,789B2 describes a measurement method determining an average on an alternating current.

However, this method is limited only to alternating currents assumed to have a zero average value.

The documents U.S. Pat. No. 8,981,701 B2 and US20150214881 A1 each describe a passive and static method for compensation by measuring the offset just before starting operation of the apparatus.

However, this method is limited to a static measurement only at start-up and does not allow dynamic compensation for the offset error of the acquisition system during operation of the apparatus.

The document US20140253004A1 describes a method which allows, by using the existing circuit and a specific motor control sequence, dynamic compensation for the offset error of an acquisition system comprising current sensors.

However, this method is limited only to Brushless DC motors or permanent magnet synchronous motors.

In addition, this method comprises a compensation sequence that must be executed periodically.

BRIEF SUMMARY OF THE INVENTION

Thus, the goal of this invention is to solve all or a portion of the aforementioned drawbacks. In particular, one goal of the invention then is to propose a method for dynamic compensation for the offset error of an acquisition system comprising a current sensor that can be implemented in the greatest number of apparatuses in order to conserve increased precision in current measurement and limit measurement drift over time.

Another goal is to be able to initiate the compensation sequence regardless of whether this is done periodically or aperiodically.

For this purpose, this invention relates to a method for dynamic compensation for the offset error of an acquisition system comprising a current sensor designed to measure or estimate the current passing through an actuator of an electrical apparatus that is electrically powered by an AC voltage, said acquisition system having a predetermined offset value, and said method comprising the following steps:
  determine a plurality of periodic temporal operating ranges of the actuator to dynamically apply a compensation sequence for the offset error of the acquisition system,
  execute the compensation sequence during any one of the plurality of determined temporal operating ranges,
  the synchronization between the any one of the determined temporal operating ranges of the actuator and the execution of the compensation sequence being performed using synchronization means comprising a synchronization module designed to identify reference times from the AC supply voltage of the sector, the said compensation sequence comprising the following steps:

(i) shut off the electrical power supply to the actuator so as to interrupt the passage of current in the current sensor, (ii) wait for a predetermined period at the end of which it is considered or expected that current is no longer passing through the current sensor, (iii) measure an actual offset value of the acquisition system, (iv) consider this actual offset value as the new offset value of the acquisition system, (v) electrically power the actuator so as to ensure the passage of current in the current sensor, (vi) use the new offset value of the acquisition system to control the actuator.

This provision makes it possible to simply and inexpensively compensate for the offset error of an acquisition system comprising a current sensor.

The predetermined period at the end of which it is considered that current is no longer passing through the current sensor is intrinsically related to the type of actuator and to the components of the acquisition system.

This invention is not limited only to Brushless DC motors or to permanent magnet synchronous motors, but can be applied to other electronic, mechanical or electromechanical actuators necessitating a current measurement.

This invention is able to correct the offset error of an acquisition system comprising a current sensor measuring a direct current or an alternating current or a direct current comprising an alternating component (modulation).

The temporal operating ranges are periodic, but the compensation sequence can be applied periodically or aperiodically during any one of these temporal operating ranges.

This invention necessitates an auxiliary measurement which will make it possible to synchronize the execution of the compensation sequence and a determined temporal operating range.

In addition, this method can be transposed to any electronic card integrating an acquisition system comprising a current sensor, and an actuator whose time constant is significantly greater than a few milliseconds.

According to one implementation of the method, the predetermined period at the end of which it is considered that current is no longer passing through the current sensor is intrinsically related to the type of actuator and to the components of the acquisition system.

This period is therefore longer or shorter depending on the acquisition system and the actuator.

According to one implementation of the method, the temporal ranges are determined such that the execution of the compensation sequence does not modify the value of a determined operating characteristic of the actuator beyond a determined threshold.

Such an operating characteristic may, for example, comprise the noise associated with starting up an induction generator, the temperature of a utensil heated by the induction generator, or the speed or torque of a motor.

Thus, this invention is able to perform the compensation for the offset error of an acquisition system statically on start-up but also dynamically, that is, during operation of the apparatus, and the user will not observe any modification in the operation of the apparatus, in particular a variation in the noise associated with starting up an induction generator, a variation in the temperature of a utensil heated by the induction generator, or a variation in the speed or torque of a motor.

According to one implementation of the method, the actuator is an induction generator, a universal motor or an asynchronous motor controlled by appropriate electronics, the asynchronous motor being associated with an electronic circuit designed to prevent the motor from operating in a generator mode during the temporal ranges.

According to one implementation of the method, the any one of the determined temporal operating ranges comprises the time at which the AC supply voltage of the sector crosses zero, and if applicable the determined operating characteristic of the induction generator comprises the sound level of the noise emitted by the induction generator during the transmission of energy from the induction generator to a utensil to be heated, or the variation in temperature of the utensil to be heated, and if applicable the determined operating characteristic of the actuator comprises the rotation speed or torque of the motor.

According to one implementation of the method, the actuator is a direct current motor or a permanent magnet synchronous motor, each of these motors being associated with an electronic circuit designed to prevent the motor from operating in a generator mode during the temporal ranges.

According to one implementation of the method, the any one of the determined temporal operating ranges comprises the time at which the AC supply voltage of the sector crosses the maximum and/or minimum value, and the determined operating characteristic of the motor comprises the speed of rotation or torque of the motor.

This invention also relates to an electrical apparatus intended to be electrically powered by AC voltage, and comprising:
  an actuator,
  an acquisition system comprising a current sensor intended to measure or estimate the current passing through the actuator, and
  in the event that the actuator is a motor with a generator operating mode, then the electrical apparatus comprises an electronic circuit connected to the motor and designed to prevent the motor from operating in its generator mode during the temporal ranges,
  synchronization means to determine a plurality of periodic temporal operating ranges of the actuator to dynamically execute a compensation sequence for the offset error of the acquisition system during any one of the plurality of determined temporal operating ranges, the said synchronization means comprising a synchronization module designed to identify reference times from the AC supply voltage of the sector,
  processing means designed to implement a method as described previously.

The invention is more favorably used for apparatuses comprising power elements integrating a current sensor, such as:
  apparatuses comprising a motor, regardless of the motor type,
  apparatuses comprising a heating element such as a resistor of any kind, screen printed or soldered,
  apparatuses comprising an induction generator.

A synchronization module is already present in most electrical apparatuses that are able to be supplied with AC voltage by the sector and necessitate a clock signal.

According to one aspect of the invention, the actuator is an induction generator, an asynchronous motor controlled by appropriate electronics, a permanent magnet synchronous motor or a universal motor.

BRIEF DESCRIPTION OF THE DRAWINGS

Other advantages and characteristics of the invention will be better seen by reading the detailed description of the invention, provided on an illustrative and not restrictive basis in reference to the figures which illustrate all or part of a method of compensating for the offset error according to the invention.

DETAILED DESCRIPTION

Only the elements necessary for understanding the invention have been represented. To facilitate reading of the drawings, the same elements bear the same references from one figure to the next.

Figure 1:
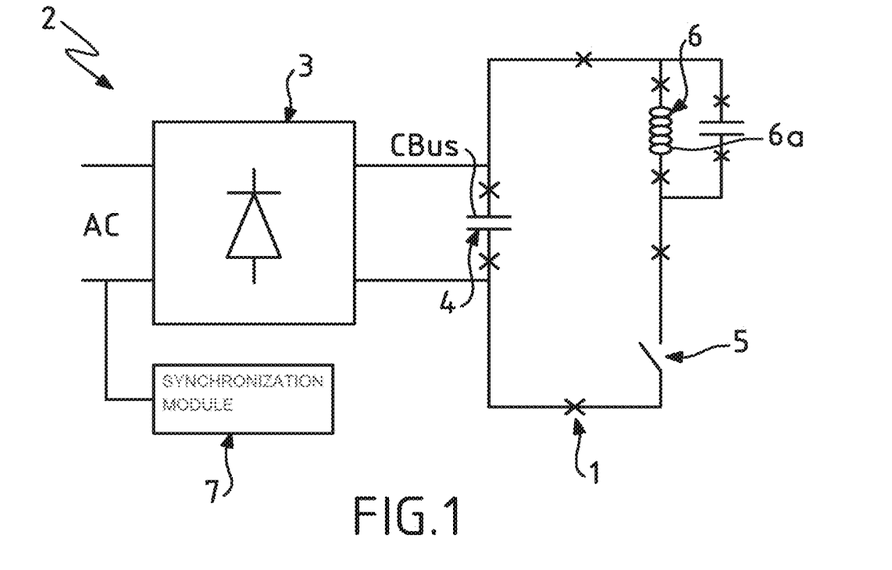
FIG. 1 illustrates a first traditional architecture of an electrical circuit of an induction generator.
Figure 2:
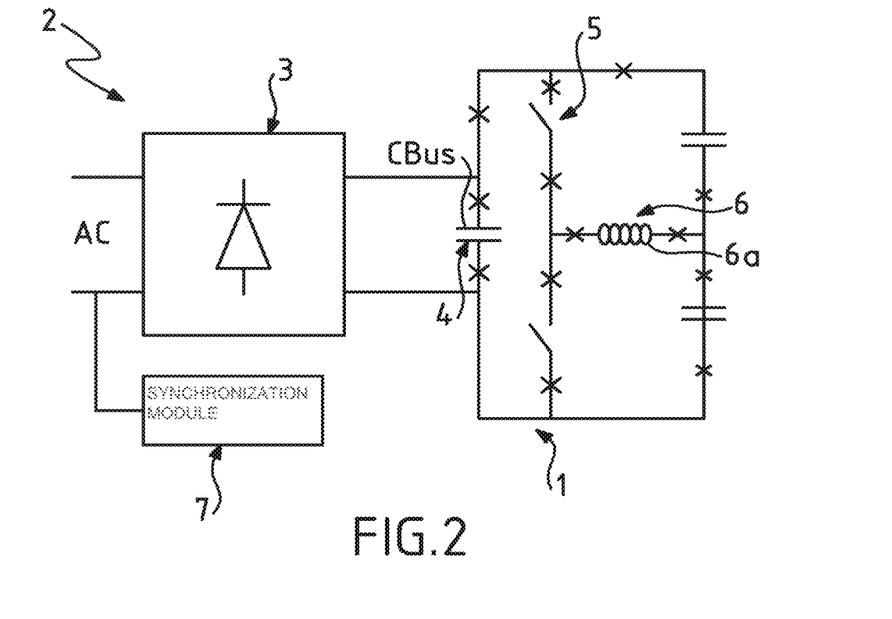
FIG. 2 illustrates a second traditional architecture of an electrical circuit of an induction generator.

In the example proposed in FIGS. 1 and 2, the actuator 6 is an induction generator 6a.

The traditional architectures of an electrical circuit 2 of an induction generator 6a, illustrated in these two FIGS. 1 and 2, integrate a current measurement allowing control of the current amplitude and the power transmitted to the materials to be heated.

This current measurement is critical and fundamental in the operation of the induction generator 6a. A small measurement error implies a significant error on the current in the induction generator 6a and thus on the power transmitted to the materials to be heated.

In order to measure or estimate the current passing through the induction generator 6a, a current sensor 1 can be positioned at various places in the electrical circuit 2 represented by a cross in FIGS. 1 and 2.

Figure 4:
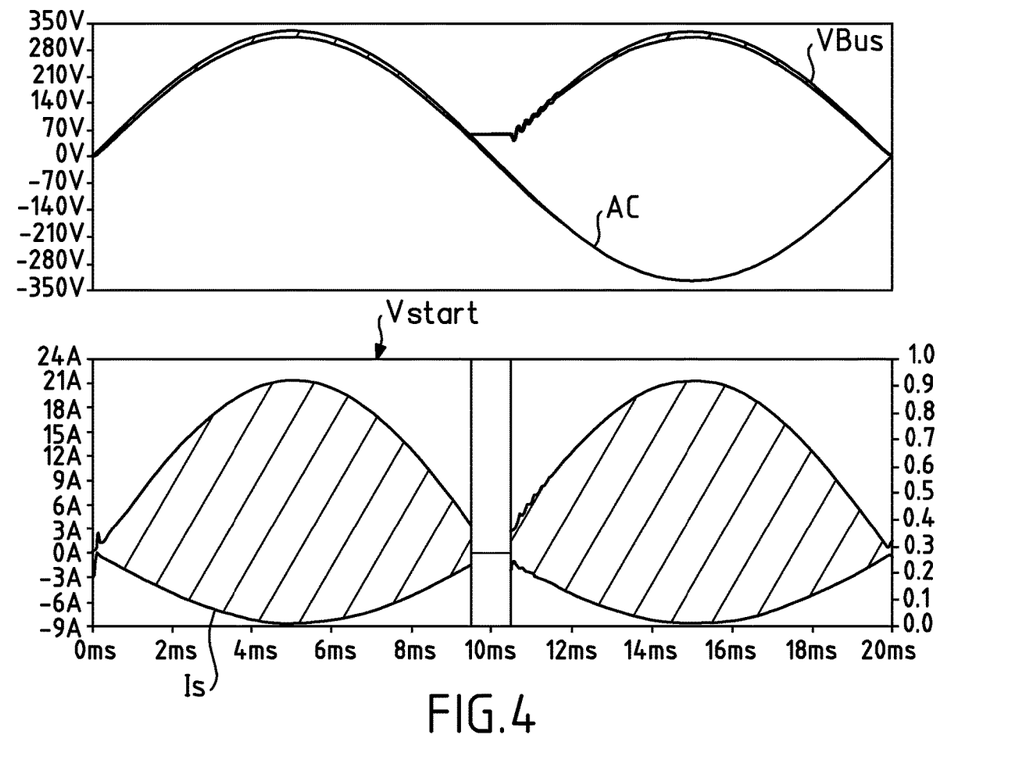
FIG. 4 illustrates the time evolution of the electrical signals used to implement a method for dynamic compensation for the offset error of an acquisition system in an induction generator.
Figure 6:
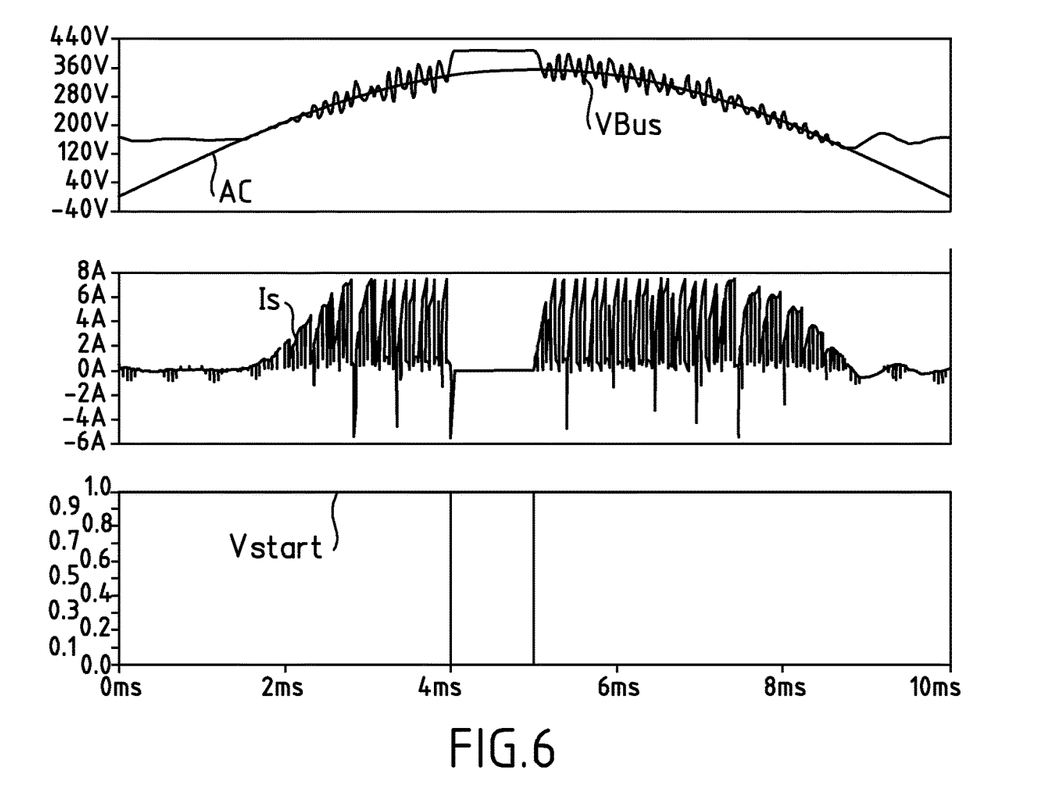
FIG. 6 illustrates the time evolution of the electrical signals used to implement a method for dynamic compensation for the offset error of an acquisition system in a permanent magnet synchronous motor.

In the simulations proposed in FIGS. 4 and 6, the current measurement is performed at the location where a cross is surrounded.

In the example proposed, the electrical circuit 2 further comprises a voltage rectifier 3, capacitors 4 and power switches 5.

Figure 3:
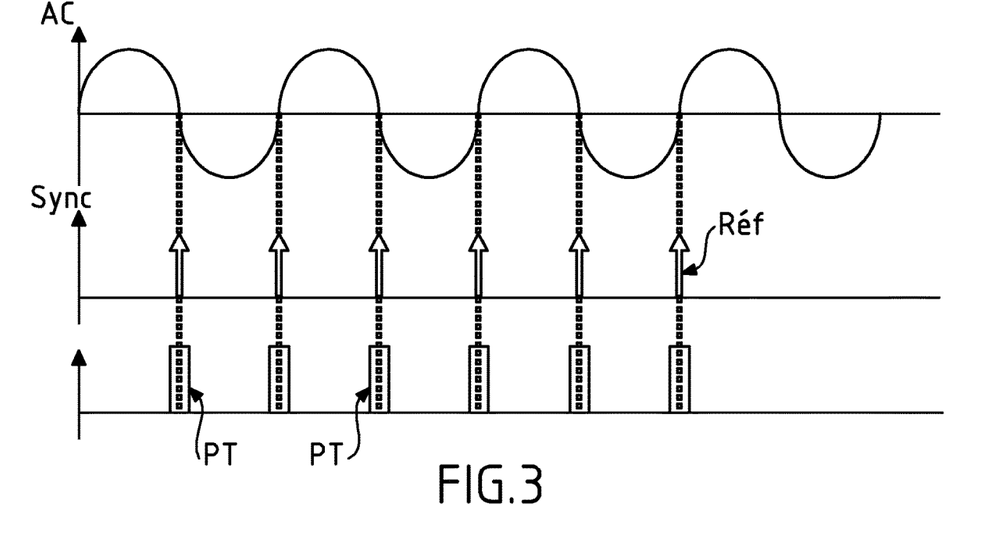
FIG. 3 illustrates the manner of determining the temporal operating ranges during which it is appropriate to execute a compensation sequence of a method for dynamic compensation for the offset error of an acquisition system in an induction generator or a universal motor or an asynchronous motor controlled by appropriate electronics.
Figure 5:
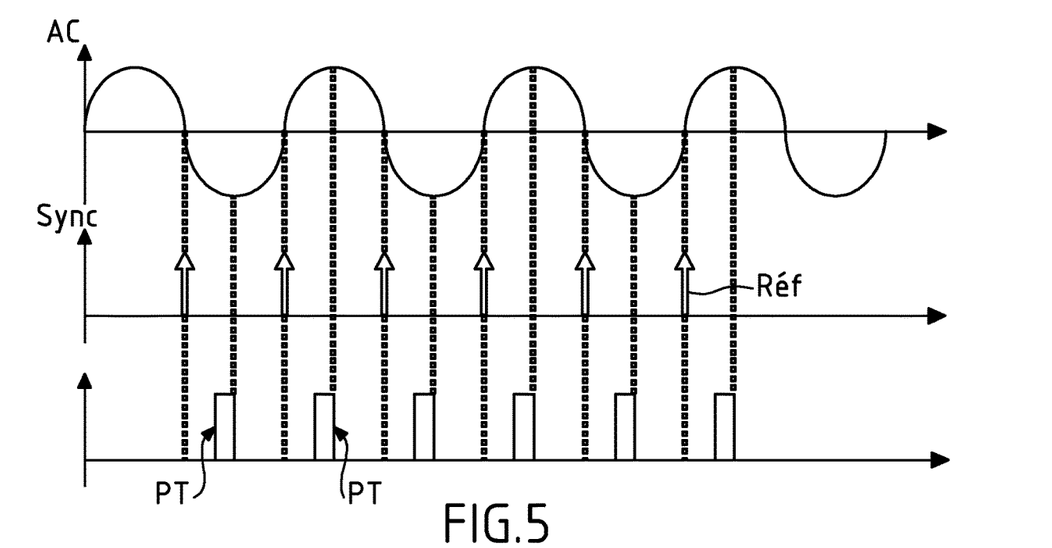
FIG. 5 illustrates the manner of determining the temporal operating ranges during which it is appropriate to execute a compensation sequence of a method for dynamic compensation for the offset error of an acquisition system in a permanent magnet synchronous motor or a direct current motor.

This electrical circuit 2 is powered by AC voltage provided by the sector and whose signal shape is illustrated on the upper part of FIGS. 3 and 5.

In addition, this electrical circuit 2 is connected upstream of the voltage rectifier 3 to synchronization means comprising a synchronization module 7.

This synchronization module 7 makes it possible to define reference times Ref from the AC supply voltage AC of the sector C.

Of course, the synchronization module 7 could be connected differently to the voltage rectifier 3, in particular downstream of the latter.

In this case, the reference times Ref are defined at times where the signal changes slope, that is, at the maximum and/or when the rectified bus voltage crosses zero.

The method according to the invention comprises a step consisting of determining a plurality of periodic temporal operating ranges PT of the actuator in order to dynamically apply a compensation sequence SC for the offset error of the acquisition system.

These temporal ranges PT are periodic and determined such that the execution of the compensation sequence SC does not modify the value of a determined operating characteristic of the actuator beyond a determined threshold.

In addition, these temporal ranges PT are synchronized in relation to the reference times Ref defined by the synchronization module 7.

Nevertheless, a compensation sequence SC can be executed during any one of the plurality of determined temporal operating ranges PT.

For example, the operating principle of the induction generator 6a is that when the maximum supply voltage AC is present at the input of the voltage rectifier 3, the power available to heat the container and thus the current measured by the current sensor 1 is maximum.

Conversely, when the supply voltage AC is zero, the current is no longer passing through the current sensor 1 and the power provided to the induction generator 6a is theoretically zero.

Thus, when the supply voltage AC is practically zero, it can be considered that the power transmitted is negligible in relation to the power transmitted when the supply voltage AC is maximum.

The compensation sequence SC for an induction generator 6a must thus be executed when the supply voltage AC is below a determined threshold, for example, between more or less 15% of the amplitude of the maximum or minimum supply voltage AC.

In this way, the compensation sequence SC will not modify the value of a determined operating parameter of the induction generator beyond a determined threshold.

For example, for a rated supply voltage AC of 230V/50 Hz, it seems appropriate to execute the compensation sequence SC when the supply voltage AC is between −50V and +50V, which corresponds to temporal operating ranges PT of a few milliseconds.

As illustrated in FIG. 3, these temporal operating ranges PT are, for example, 2 ms, and are centered on the moment the AC supply voltage of the sector crosses zero.

In the case of an induction generator 6a, the operating characteristic can be the noise caused by the induction generator during the transmission of energy from the induction generator 6a to a utensil to be heated or the temperature variation of the utensil to be heated.

This utensil may, for example, be arranged on an induction cooker or in a culinary preparation appliance.

Thus, during the execution of the compensation sequence SC during the determined temporal operating range, the sound level of the noise caused by the induction generator is lower than a determined noise threshold, or the temperature variation is lower than a determined threshold, which presents the advantage that the user of the induction generator does not notice a change in the operation of the induction generator.

Figure 9:
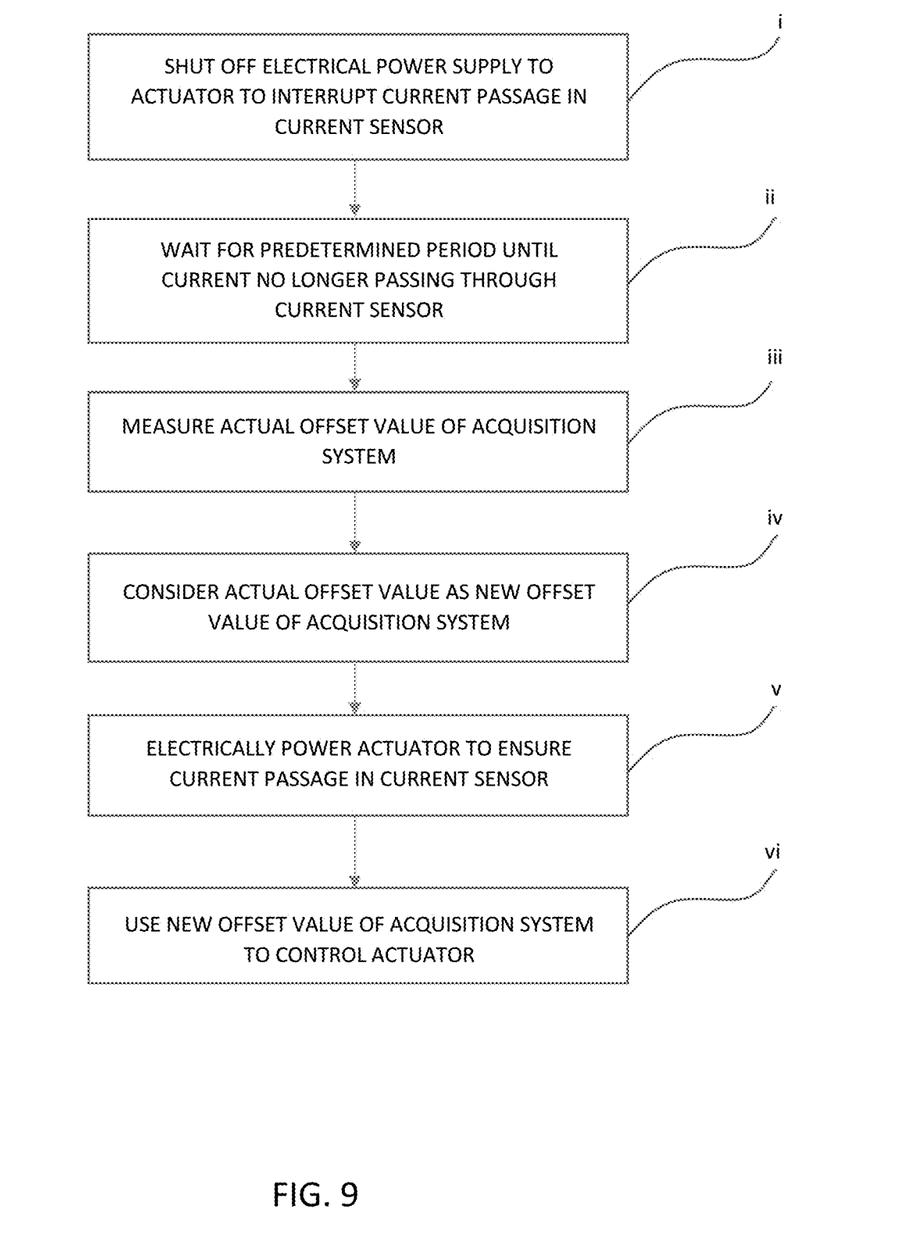
FIG. 9 is a flowchart illustrating the steps of a compensation sequence of a method according to the invention.

The compensation sequence SC comprises several steps illustrated in FIG. 9.

The first step (i) consists of shutting off the electrical power supply to the induction generator 6a so as to interrupt the passage of current in the current sensor 1.

As illustrated in FIG. 4, during this step the current will begin to be nullified through the current sensor 1.

On this FIG. 4, the signal VBus corresponds to the voltage across the capacitor CBus placed at the output of the voltage rectifier 3 on the architecture of the electrical circuit 2 illustrated in FIG. 2.

This signal VBus corresponds to the AC supply voltage rectified by the voltage rectifier 3.

This signal VBus thus includes only one positive component.

As for the signal Vstart, it corresponds to the command signal allowing the power supply to be shut off and restored, and thus making it possible to disallow and allow the passage of current in the induction generator 6a and thus in the sensor 1 of the acquisition system.

This signal Vstart thus defines the temporal ranges PT during which the compensation sequence SC is executed.

As illustrated in FIG. 4, this command signal Vstart is synchronized to the signal Sync transmitted by the synchronization module 7.

On FIG. 4, this temporal range is 1 ms and is situated between 9.5 ms and 10.5 ms.

The signal Is corresponds to the value of the electrical current measured by a current sensor 1 at the output of the voltage rectifier 3.

During a second step (ii), we wait during a predetermined period at the end of which it is considered or expected that current is no longer passing through the current sensor 1.

This period generally corresponds to the time constant of the electrical circuit 2.

This period is very short for an induction generator 6a.

On FIG. 4, we note that the current Is is nullified almost instantaneously in the current sensor 1 when the command signal Vstart shuts off the electrical power supply.

During a third step (iii), an actual offset value of the acquisition system is measured.

This measurement illustrates the gap between what had been considered the offset up to then and the actual offset of the acquisition system.

In fact, given that after the determined period it is considered that the current is no longer passing through the current sensor 1, the value measured at that moment by the current sensor 1 should theoretically correspond to the actual offset of the acquisition system.

Thus, the current sensor 1 should be calibrated during a fourth step (iv) considering this actual offset to be the new offset value of the acquisition system.

Once the offset of the acquisition system has been corrected, during a fifth step (v) the command signal Vstart restores power supply to the induction generator 6a so as to ensure the passage of current through the current sensor.

During a subsequent step (vi), the new offset value of the acquisition system is used to control the actuator.

During this compensation sequence SC, the user does not notice any change in the operation of his induction generator.

The implementation of the method described above in reference to an induction generator can analogously be implemented for a universal motor or an asynchronous motor controlled by appropriate electronics, an inverter, for example.

Considering an implementation for an asynchronous motor, the person skilled in the art knows that in this case the motor must be associated with an electronic circuit designed to prevent the motor from operating in a generator quadrant during the temporal ranges during which the compensation sequence is executed.

Advantageously, a compensation sequence SC comprising the same steps can also be executed when the actuator is a permanent magnet synchronous motor, in particular a brushless synchronous motor or a direct current motor.

Just as for the universal motor, there are two operating modes for a permanent magnet synchronous motor or a direct current motor.

A first mode of operation as a generator, where the motor restores energy, and a second mode of operation as a motor, where energy is provided to the motor by electronics.

In the majority of electrical apparatuses integrating permanent magnet synchronous motors or a direct current motor, the first generator operating mode is not controlled through the architectures of the electronic circuit, which in particular integrate freewheeling diodes.

Thus, such motors operate according to their first generator operating mode when the value of the AC voltage supplying the motor is less than the electromotive force of the motor and operates according to its second motor operating mode when this same value is greater than the electromotive force of the motor.

In the first generator operating mode, the motor powers the electronics, through the freewheeling diodes.

Consequently, it is not possible to ensure that the current is nullified in the current sensor 1 when the power supply to the motor is cut.

Therefore, it is not in the first generator operating mode that the compensation sequence SC must be executed. During the second motor operating mode, energy flows from the power supply of the sector towards the motor.

In this second operating mode, the supply voltage AC of the sector is greater than the electromotive force of the motor.

Thus, when the power supply of the motor is shut off at a time when the latter was in its second motor operating mode, the motor will no longer operate according to its first generator operating mode because the electronic architecture does not allow it.

The mechanical energy of the motor dissipates in the form of mechanical losses and the current is nullified in the motor and in the current sensor 1.

During this period, it is then possible to perform the compensation sequence SC for the offset error of the acquisition system.

It would also be possible to execute the compensation sequence SC on other determined temporal ranges PT, if the motor is associated with an electronic circuit designed to prevent the motor from operating in a generator quadrant during these other temporal ranges.

As illustrated in FIG. 5, in the example presented the temporal operating ranges PT of the permanent magnet synchronous motor are determined shortly before the time when the supply voltage AC of the sector reaches its maximum value.

These temporal ranges PT are thus synchronized to these reference times Ref through the synchronization module 7, the time interval between the signal delivered by the synchronization module 7 and the start of the temporal range being constant.

In the example presented, the temporal operating ranges PT are 1 ms.

In the case of a motor, the determined operating characteristic may be the rotation speed or the torque of the rotor.

Thus, during the execution of the compensation sequence SC during the determined temporal operating ranges PT, the speed and the torque of rotation of the motor due to its mechanical inertia are greater than a determined speed or torque threshold, which has the advantage that the user of the motor does not notice a change in the operation of the motor, in particular due to the absence of jerky movements.

The compensation sequence SC includes the same steps (i) to (iv) described above in reference to the induction generator 6a.

In FIG. 6, the signal VBus corresponds to the voltage across the capacitor 4 situated at the output of the rectifier 3.

As for the signal Vstart, it corresponds to the command signal making it possible to shut off and restore the power supply to the motor.

However, unlike the induction generator 6a, this signal does not disallow the passage of current in the current sensor 1 except in cases where the signal VBus at the time of shut-off is greater than the electromotive force of the motor.

Just as for the induction generator 6a, the signal Vstart defines the temporal ranges PT during which the compensation sequence SC is executed.

As illustrated in FIG. 6, this command signal Vstart is synchronized to the signal Sync transmitted by the synchronization module 7.

On FIG. 6, this temporal range is 1 ms and is situated between 4 ms and 5 ms.

The signal Is corresponds to the value of the electrical current measured by a current sensor 1.

On FIG. 6, we can also see that the current Is takes a bit more time to be nullified in the current sensor 1 than in the case of the induction generator 6a when the command signal Vstart shuts off power to the motor.

Nevertheless, this time is much shorter than a temporal range during which a compensation sequence SC can be executed.

Figure 7:
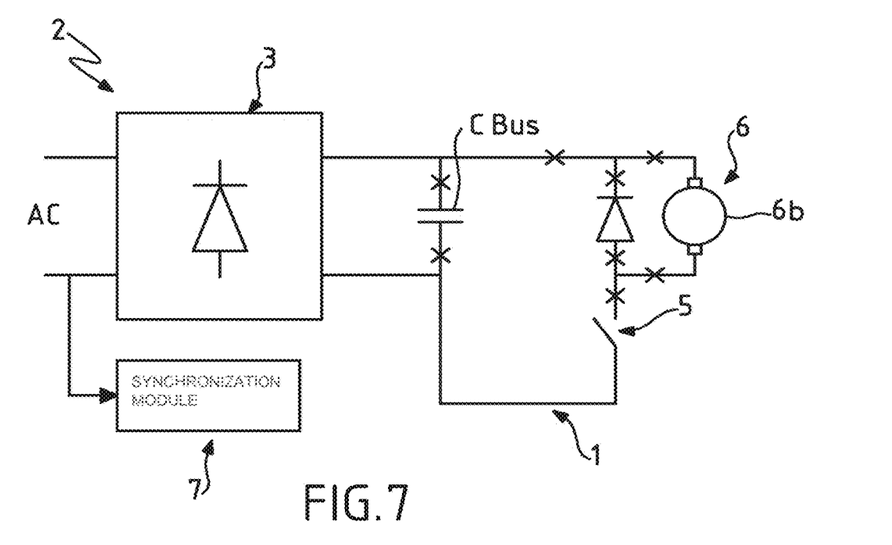
FIG. 7 illustrates a traditional architecture of an electrical circuit for a universal motor integrating a chopper.

In the example proposed in FIG. 7, the actuator 6 is a universal motor 6b.

This electrical circuit 2 comprises the same elements on the one previously described for an induction generator 6a.

In order to measure or estimate the current passing through the universal motor 6b, a current sensor 1 can be positioned at various places in the electrical circuit 2 represented by a cross.

Figure 8:
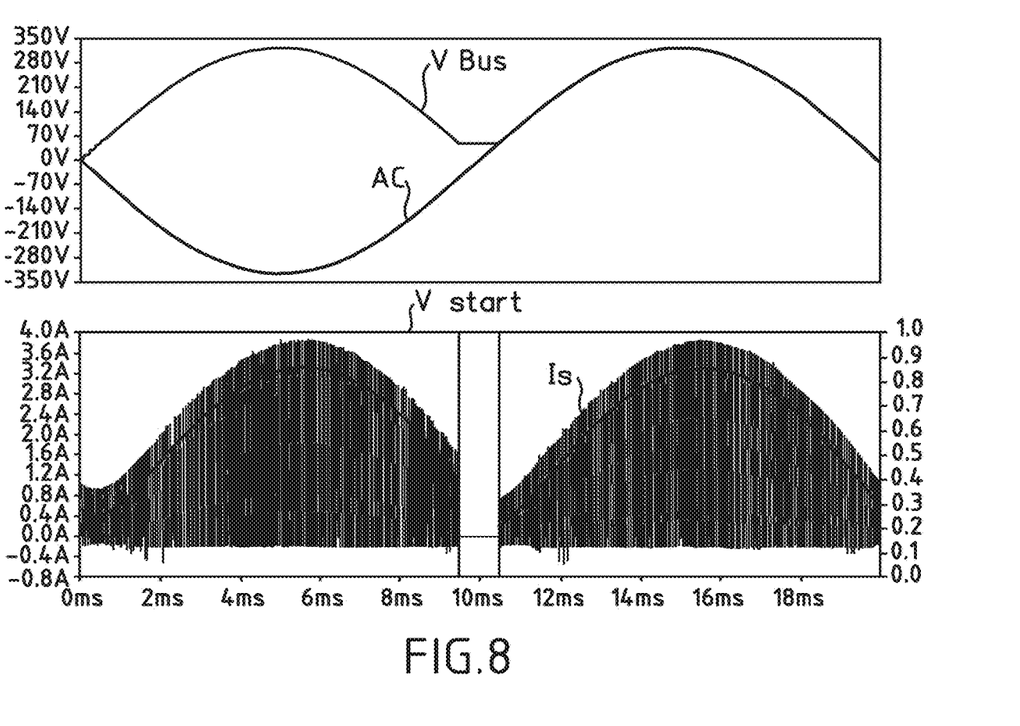
FIG. 8 illustrates the time evolution of the electrical signals used to implement a method for dynamic compensation for the offset error of an acquisition system in a universal motor.

In the simulation proposed in FIG. 8, the current measurement is performed at the location where a cross is surrounded.

For a universal motor 6b, the compensation sequence SC can be executed at any time.

Nevertheless, just as for the induction generator, the compensation sequence is preferably executed in temporal operating ranges PT centered on the moment the AC supply voltage of the sector crosses zero.

In fact, unlike a permanent magnet synchronous motor, this type of motor cannot operate in generator mode, because the electromotive force and the current are always of the same sign.

As is the case for the induction generator or the permanent magnet synchronous motor, the duration of the temporal ranges PT depends on the characteristics of the motor (inductance, resistance, etc.) and the characteristics of the acquisition system (location of the measurement, type of conditioning circuit, etc.), and is of a few milliseconds.

Although the invention has been described in connection with particular embodiment examples, it is quite obvious that it is in no way limited to these.

Modifications are still possible, in particular from the point of view of arrangement and constitution of the different components or by substitution of equivalent techniques, without departing from the scope of protection of the invention.

The invention claimed is:

1. A method for dynamic compensation for the offset error of an acquisition system comprising a current sensor arranged to measure or estimate a current passing through an actuator of an electrical apparatus that is electrically powered by an AC voltage, said acquisition system having a predetermined offset value, and said method comprising:
   determining a plurality of periodic temporal operating ranges of the actuator to dynamically apply a compensation sequence for the offset error of the acquisition system, and
   executing the compensation sequence during any one of the plurality of determined temporal operating ranges,
   wherein the compensation sequence comprising:
      shutting off the electrical power supply to the actuator so as to interrupt the passage of current in the current sensor,
      waiting for a predetermined period at the end of which it is considered or expected that current is no longer passing through the current sensor,
      measuring an actual offset value of the acquisition system,
      considering the actual offset value as the new offset value of the acquisition system,
      electrically powering the actuator so as to ensure the passage of current in the current sensor, and
      using the new offset value of the acquisition system to control the actuator.

2. The method according to claim 1, in which the temporal ranges are determined such that the execution of the compensation sequence does not modify the value of a determined operating characteristic of the actuator beyond a determined threshold.

3. The method according to claim 1, in which the actuator is an induction generator, a universal motor or an asynchronous motor controlled by appropriate electronics, the asynchronous motor being associated with an electronic circuit arranged to prevent the motor from operating in a generator mode during the temporal ranges.

4. The method according to claim 3, in which the any one of the determined temporal operating ranges comprises the time at which the AC supply voltage of the sector crosses zero, and if applicable the determined operating characteristic of the induction generator comprises the sound level of the noise emitted by the induction generator during the transmission of energy from the induction generator to a utensil to be heated, or the variation in temperature of the utensil to be heated, and if applicable the determined operating characteristic of the actuator comprises the rotation speed or torque of the motor.

5. The method according to claim 1, in which the actuator is a direct current motor or a permanent magnet synchronous motor, each of the motors being associated with an electronic circuit designed to prevent the motor from operating in a generator mode during the temporal ranges.

6. The method according to claim 5, in which the any one of the determined temporal operating ranges comprises the time at which the AC supply voltage of the sector crosses the maximum and/or minimum value, and the determined operating characteristic of the motor comprises the speed of rotation or torque of the motor.

* * * * *